US006683504B1

United States Patent
Abernathy

(10) Patent No.: US 6,683,504 B1
(45) Date of Patent: Jan. 27, 2004

(54) RING OSCILLATOR WITH RANDOM NOISE CANCELLATION

(75) Inventor: Brian Lee Abernathy, Poway, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 09/662,444

(22) Filed: Sep. 15, 2000

(51) Int. Cl.⁷ .................................................. H03B 5/02
(52) U.S. Cl. ............................... 331/57; 331/46; 331/45; 331/74; 331/56; 327/158
(58) Field of Search ............................... 331/57, 46, 45, 331/56, 74; 327/156, 158

(56) References Cited

U.S. PATENT DOCUMENTS

| | | | |
|---|---|---|---|
| 5,347,234 A | * | 9/1994 | Gersbach et al. ............ 331/1 A |
| 5,475,344 A | | 12/1995 | Maneatis et al. ............. 331/57 |
| 5,706,218 A | | 1/1998 | Hoffman ...................... 364/717 |
| 5,717,362 A | | 2/1998 | Maneatis et al. ............. 331/57 |
| 5,864,258 A | | 1/1999 | Cusinato et al. ............. 331/34 |
| 6,094,103 A | | 7/2000 | Jeong et al. .................. 331/57 |
| 6,104,253 A | * | 8/2000 | Hall et al. .................... 331/56 |
| 6,188,291 B1 | * | 2/2001 | Gopinathan .................. 331/45 |

* cited by examiner

Primary Examiner—Arnold Kinkead
(74) Attorney, Agent, or Firm—INCAPLAW; Terrance A. Meador

(57) ABSTRACT

A ring oscillator integrated circuit is provided that is comprised of a plurality of parallely arranged ring oscillator sections, where a ring oscillator section can be any conventional ring oscillator circuit. That is, the inputs and the outputs of a plurality of conventional ring oscillators are connected together. Since each ring oscillator section output signal includes random noise, the parallel arrangement of ring oscillators, and the summing of several oscillator signals, causes at least some noise cancellation. As a result, a lower noise oscillator signal is supplied. A method of reducing random noise in a ring oscillator circuit is also provided.

17 Claims, 8 Drawing Sheets

RING OSCILLATOR WITH RANDOM NOISE CANCELLATION

BACKGROUND OF THE INVENTION

1. Field of the Invention

This invention relates generally to an electrical oscillator circuit and, more particularly, to a noise optimized ring oscillator design and method for using the random distribution of multiple oscillator signals to supply a low-noise oscillator signal product.

2. Description of the Related Art

Conventionally, oscillator signals are used in transmitter and receiver circuits in the processes of sending or receiving signals which communicate information. Noise that becomes mixed in with the communicated signal necessarily degrades the performance of the communication link, so that information becomes misinterpreted, the link margin between communicating parties decreases, or both. Oscillator signals are used with mixers in the up-conversion and down-conversion of carrier signals, or as reference clocks in phase-locked loop circuits to modulate or demodulate baseband signals. To maximize the performance of the communication link the oscillator signals are generated as free of noise as reasonable.

There are several types of noise that affect an oscillator signal. Coherent noise sources, such as neighboring frequency sources or power supplies create periodic signals which can be added to, or modulate the oscillator signal. Generally, these noise sources are addressed with shielding, line filtering, and adequate grounding. Other forms of noise are non-coherent or random. As is well known in the art, many components generate noise in response to temperature in accordance with the kBT formula, where T is temperature (Kelvin), k is Boltzmann's constant, and B is bandwidth (Hz). This thermal, or Johnson, noise is gaussian in response and independent of frequency. Shot noise refers to the noise generated by active devices and is expressed as qIB, where q is an electron charge, I is dc current, and B is bandwidth. It is known that this noise response is also gaussian. Low frequency noise, also called contact or flicker noise, is also gaussian and proportional to the inverse of the frequency of the noise.

In oscillator design, noise analysis is often expressed in terms of phase noise. Generally, phase noise describes the shape of the sidebands of the intended oscillator signal. The steeper the sidebands surrounding an oscillator signal, the lower the phase noise. Sideband noise is typically introduced into an oscillator feedback loop, where its frequency modulates the oscillator signal.

Noise can be minimized with the use of a high Q resonant element. Q is defined as the ratio of the center frequency to the bandwidth. Alternately, Q can be expressed as the ratio of the impedance of the frequency dependent resonant elements, capacitors and inductors, to resistance. A crystal is a highly stable resonant element with a Q in the thousands that is used in many oscillator designs. The Q of a typical inductor/capacitor resonant circuit is orders of magnitude less. As is known in oscillator design, the random and coherent noise is divided by the Q of the basic resonant elements to yield the overall phase noise response of the oscillator. Thus, a crystal oscillator circuit will generate a signal having much less phase noise that an oscillator using standard inductors and capacitors.

FIG. 1 is a conventional ring oscillator circuit 10 (prior art). The ring oscillator 10 is an inverting circuit made by series connecting logic gates. The output of the gates is 180 degrees out of phase from the input signal at low frequencies. Delay through the series connected gates becomes a factor at higher frequencies. When the overall delay equals 180 degrees, the output signal is in phase with the input signal, and as long as the circuit 10 has an overall gain, the circuit will oscillate when the output is feed back to the input of the oscillator. These ring oscillators are easy to build. They can be fabricated merely by connecting a few gates or transistors in series. Since the circuit must invert, an odd number of inverting gates can be used. As shown in FIG. 1, three inverting buffers 12, 14, and 16 are shown.

Tuning elements can be added between stages to control the frequency of oscillation. Often the parasitics of the gates are used as frequency tuning elements. Since the tuning and parasitic elements typically have relatively low Qs, the overall Q of the oscillator is low. Further, the reactances of these components are not necessarily stable, so that the frequency of resonance is subject to change. These tuning elements and component reactances account for the inherently poor Q of a ring oscillator circuit.

FIG. 2 is a precision ring oscillator (prior art). A precision ring oscillator 20 is fabricated using delay elements, where the overall circuit 20 acts as an inverter at low frequencies. As shown, the precision ring oscillator 20 is formed with three delay buffer sections 22, 24, and 26. Delay buffer 26 is a variable delay buffer including high speed and low speed delay sections 28 and 30, respectively. The output frequency is sampled at phase detector 32 and compared to a reference frequency generated by reference clock 34. The phase detector controls the operation of the high and low speed delay sections 28 and 30 to precisely control the output frequency.

It would be advantageous is a circuit could be designed to supply a low-noise oscillator signal from a higher noise oscillator source signal.

It would be advantageous if the noise factor of a ring oscillator circuit could be improved.

It would be advantageous if ring oscillator performance could be simply enhanced in an integrated circuit simply using more of the same ring oscillator components.

Likewise, it would be advantageous if the ring oscillator performance enhancement could be accomplished in the same region of the IC as where the ring oscillator is fabricated, without the necessity of running traces to other sections of the IC, or off chip.

SUMMARY OF THE INVENTION

Accordingly, an integrated circuit low noise ring oscillator is provided. The ring oscillator comprises a plurality of ring oscillator sections, where each ring oscillator section has an input and output, both connected to the inputs and outputs of the other ring oscillator sections. That is, the outputs of the ring oscillator section are summed together and supplied as a common input, so that the ring oscillator sections are connected in parallel.

Each ring oscillator includes a plurality of n delay sections. Each delay section has an input to accept a signal and an output to provide a signal that is delayed at the frequency of operation (oscillation). The delay sections are series connected, with the output of one delay section connected to the input of a subsequent delay section. The first series connected delay section is connected to the input of the ring oscillator section to accept the input signal, and the nth delay section is connected to the output of the ring oscillator to provide the output signal.

A method is also provided for reducing noise in an integrated circuit ring oscillator signal. The method comprises: generating a first oscillator signal at a first frequency; generating a second oscillator signal at the first frequency; summing the first and second oscillator signals; and, supplying a low noise output oscillator signal at the first frequency.

Generating the first oscillator signal at a first frequency includes generating a signal having a first relative noise factor. Likewise, generating the second oscillator signal at a first frequency includes generating a signal having a first relative noise factor. However, supplying the output oscillator signal at the first frequency includes supplying the output oscillator signal at a second relative noise factor, less than the first relative noise factor. The output oscillator signal relative noise factor that is calculated as follows:

relative noise=first relative noise factor/(the total number of summed oscillator signals)$^{1/2}$.

DETAILED DESCRIPTION OF THE PREFERRED EMBODIMENTS

Figure 3:
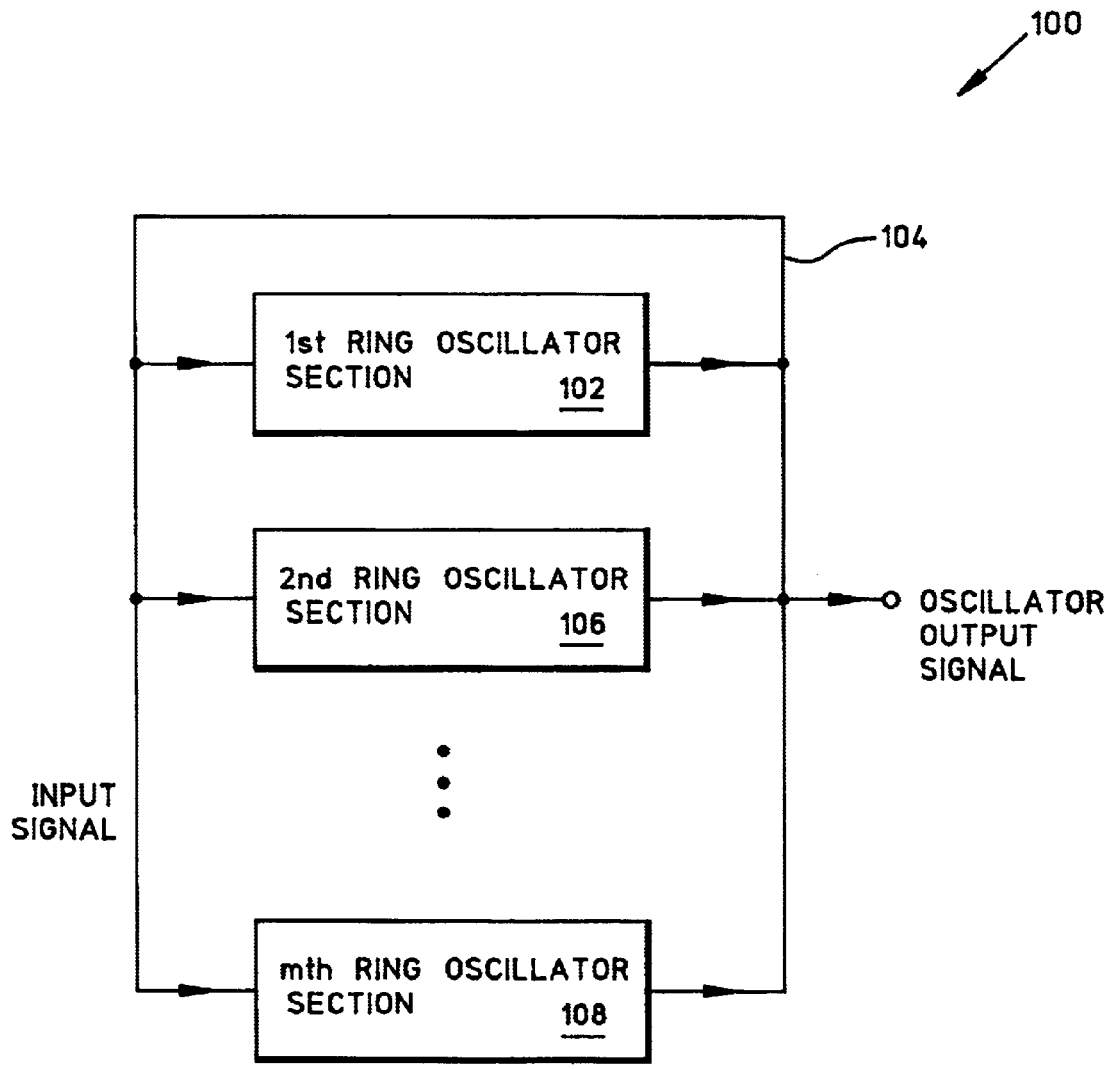
FIG. 3 is a schematic block diagram of the present invention integrated circuit low noise oscillator.

FIG. 3 is a schematic block diagram of the present invention integrated circuit low noise oscillator. The low noise oscillator 100 comprises a first ring oscillator section 102 with an input on line 104 to receive an input signal and an output, connected to the input on line 104, to supply an output signal. At least a second ring oscillator section 106 is shown having an input and an output on line 104, both connected to the input of the first ring oscillator 102. The output signals from each ring oscillator sections are summed together to supply a summed, low-noise, output signal.

Each ring oscillator section 102 and 106, and the ones to be introduced below, inverts the input signal to supply an output signal that is 180 degrees out of phase with the input signal at low operating frequencies. As is well understood, there are propagation delays through the elements of ring oscillator sections 102 and 104 which become significant at higher frequencies of operation. When the delay becomes 180 degrees with respect to the input signal, the input and output signals are in phase and the ring oscillator section will oscillate, as long as the ring oscillator section has an overall gain at the frequency of oscillation.

As explained in more detail below, the larger the number of ring oscillator sections that are connected in parallel, the greater the improvement in reducing the noise on the oscillator signal. Therefore, the low noise oscillator 100 typically includes a plurality of ring oscillator sections. The last oscillator section is represented by the mth ring oscillator section 108. The dotted line between the second ring oscillator section 106 and the mth ring oscillator section 108 is intended to represent any number of ring oscillator section between the second and mth sections. The present invention is not limited to any particular number of ring oscillator sections. Each additional ring oscillator section, including the mth ring oscillator section 108 has an input and an output connected to the input of the first ring oscillator on line 104. That is, all the outputs are summed together and supplied to each of the ring oscillator section inputs.

In one preferred embodiment of the invention (see FIG. 6), m=4, so that a third ring oscillator section (not shown in FIG. 3) has an input and an output connected to the input of the first ring oscillator on line 104, as does the fourth ring oscillator section 108.

Figure 4:
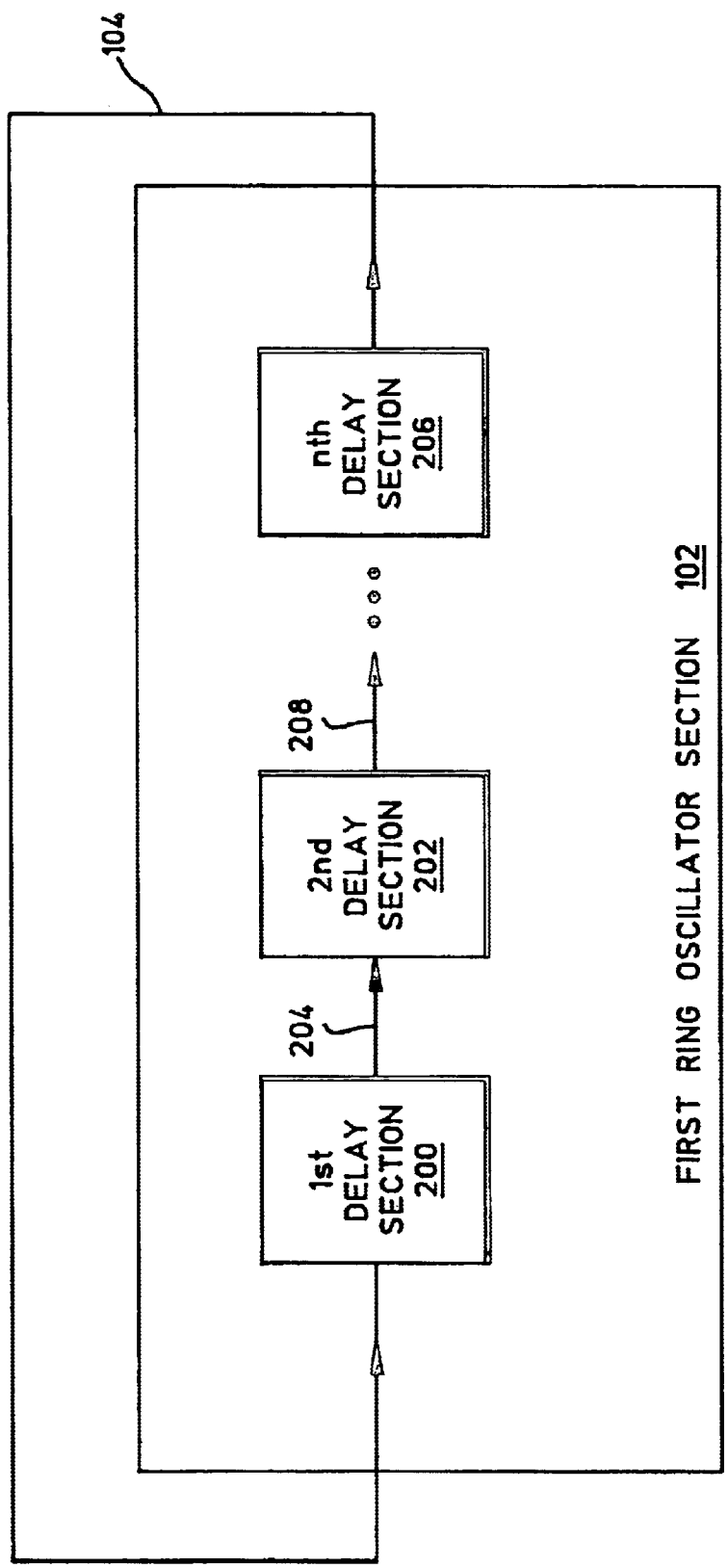
FIG. 4 is a schematic block diagram illustrating details of the first ring oscillator section of FIG. 3.

FIG. 4 is a schematic block diagram illustrating details of the first ring oscillator section 102 of FIG. 3. The first ring oscillator section 102 is representative of the other oscillator sections. The first ring oscillator section 102 includes a plurality of n delay sections, where n can be any number. Each delay section has an input to accept a signal and an output to provide a delayed signal. At least one of the delay sections must invert its input signal, since the output signal of the first ring oscillator section 102 must be inverted from the input signal at dc or low frequencies. Thus, any number of non-inverting delay sections can be used, as long as the output of the ring oscillator section 102 is inverting. If inverting delay sections are used, than any odd number of delay sections may be used. That is, n=1, 3, 5, 7, . . . .

The delay sections are series connected. The first delay section 200 has an input connected to the first ring oscillator section input to accept the input signal. The output of the first delay section 200 is connected to the input of the second delay section 202 on line 204. The output of the second delay section 202 is connected to the input of the nth delay section 206 on line 208. As mentioned above, any number of delay sections may be interposed between the second and nth delay sections. The output of the nth delay section 206 is connected to the first ring oscillator section output to supply the output signal.

Although it is not shown, in some aspects of the invention resistors and tuning elements having a frequency dependent reactance, usually capacitors, are connected to the inputs or outputs of one or more delay sections to encourage the oscillation of the circuit at a specific predetermined frequency. Often the parasitic reactances of the gates themselves are used with such tuning elements to create a circuit resonant frequency. Such schemes are more common in ring oscillators made from simple digital NAND, AND, NOR, XOR, and buffer circuits.

It is also known, but not shown, to use at least one delay section in a ring oscillator section that will only operate when an enable signal is provided (such as a NAND gate). The enable gate permits the ring oscillator to be turned on or off.

Figure 1:
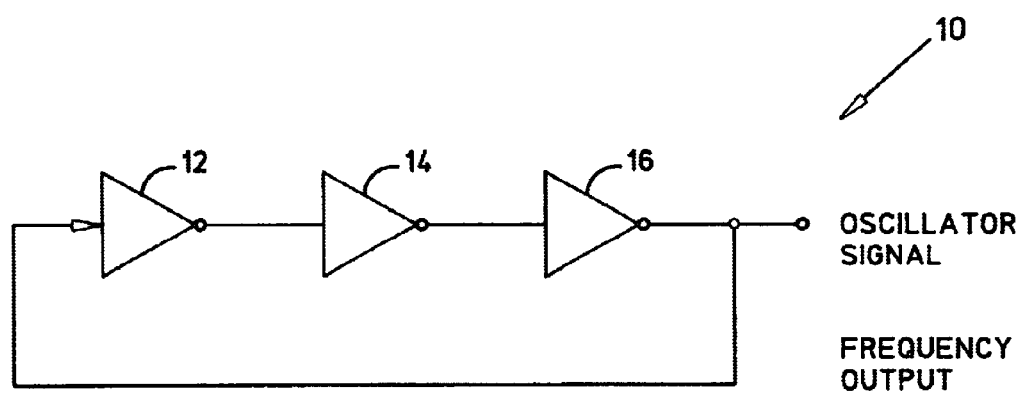
FIG. 1 is a conventional ring oscillator circuit (prior art).
Figure 2:
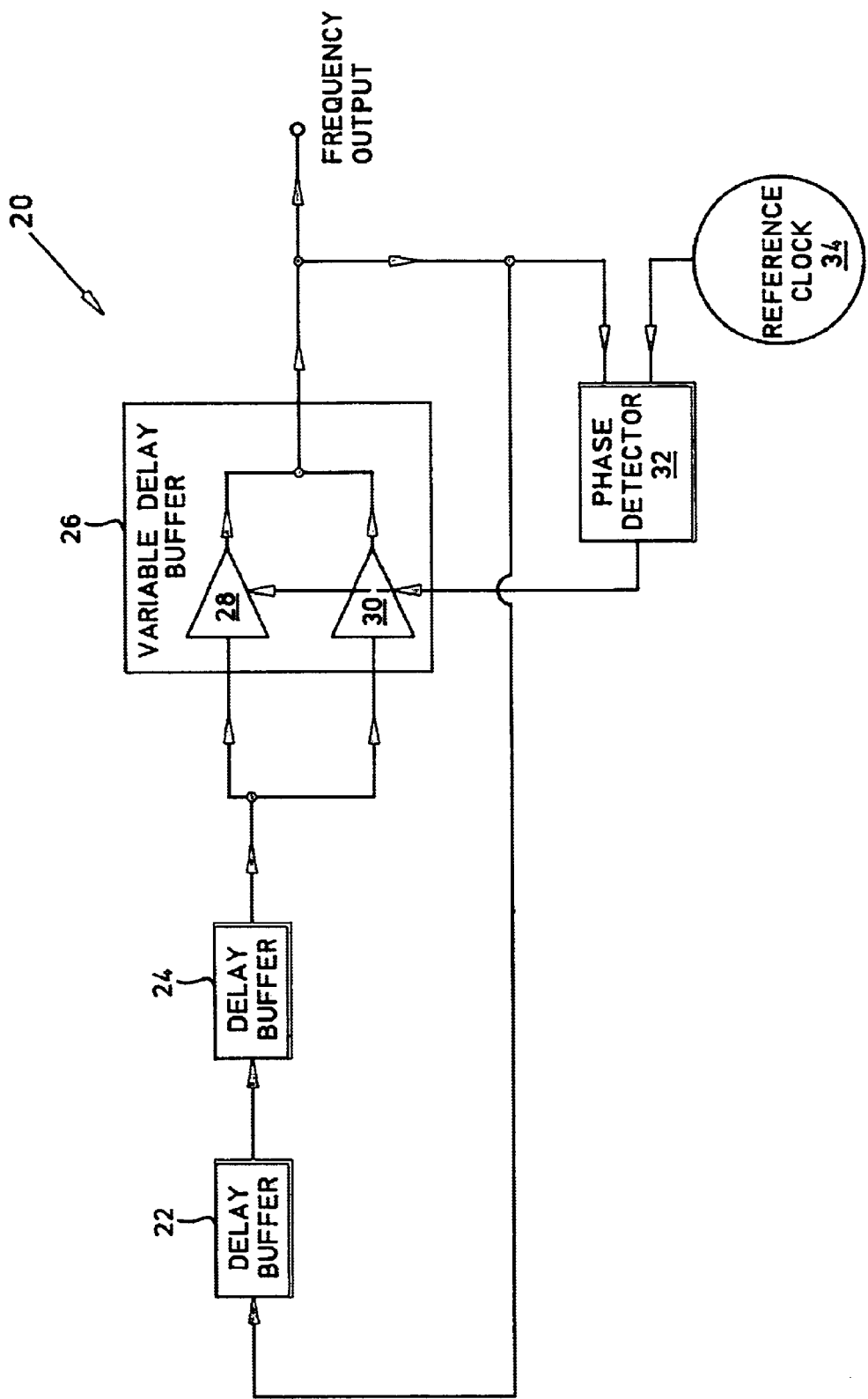
FIG. 2 is a precision ring oscillator (prior art).

As is well understood in the art, the following types of logic circuits can be configured as delay sections: AND gates, NOR gates, XOR gates, NAND gates, buffers, inverting buffers, transistors, and current-mode logic (CML) transistor pairs to name but just a few. A differential transistor pair supplies an inverted and non-inverting output, so it can be configured as either an inverting or non-inverting element. Also, delay buffers and variable delay buffers, as shown in FIG. 2, can be used in precision ring oscillators of the present invention. Conveniently, these types of gate components permit the ring oscillator to be fabricated from low-cost CMOS components.

Figure 5B:
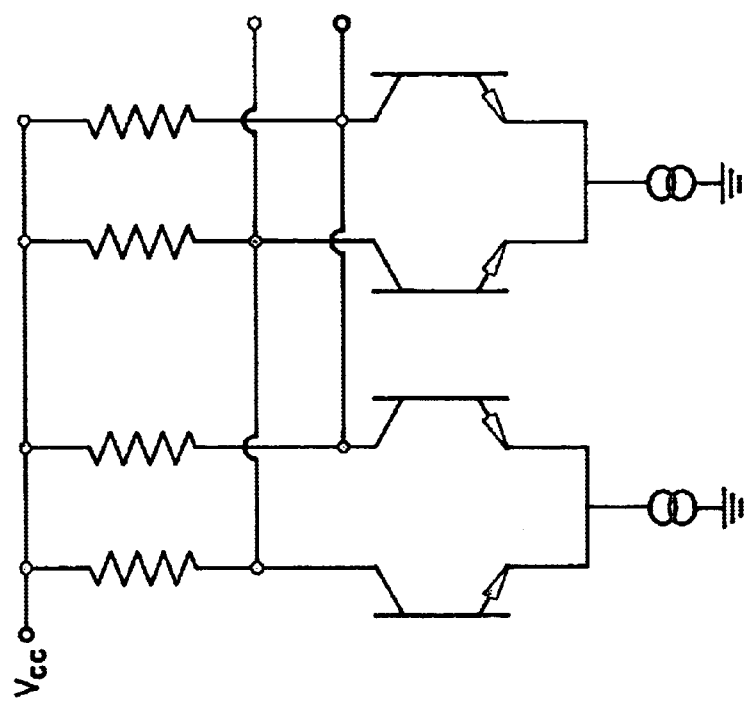
FIGS. 5a and 5b illustrate some methods for summing the outputs of the ring oscillator sections.
Figure 5A:
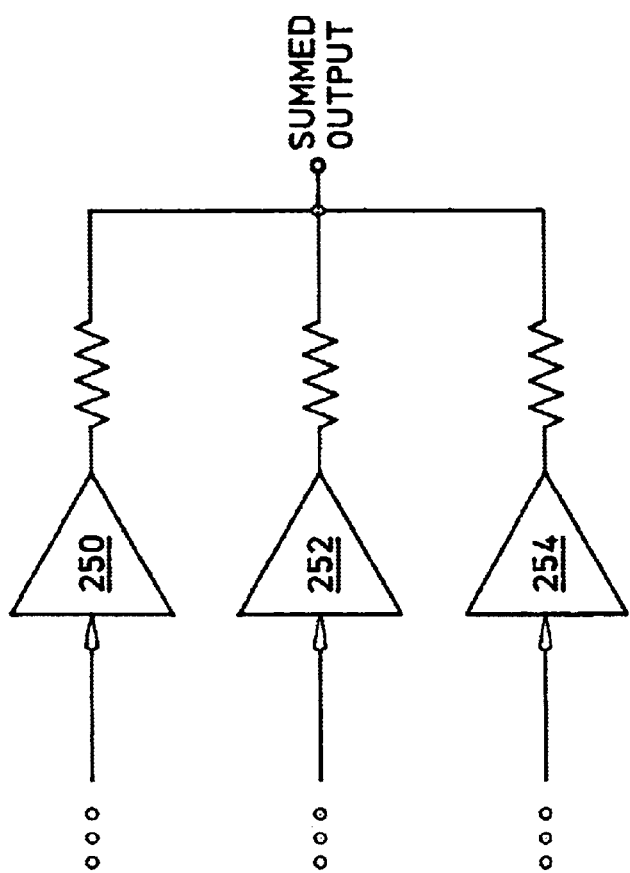

FIGS. 5a and 5b illustrates some methods for summing the outputs of the ring oscillator sections. FIG. 5a illustrates the summing of output signals from CMOS devices 250, 252, and 254. To prevent the outputs signals from one device from interfering with the operation of the other CMOS devices, buffer resistors 256, 258, and 260 have been added. Other digital buffering means are well known in the art. FIG. 5b illustrates the summing of signal using current-mode logic (CML) devices. As is well known, buffer resistors are not needed to sum output signals, either A or B.

Figure 6:
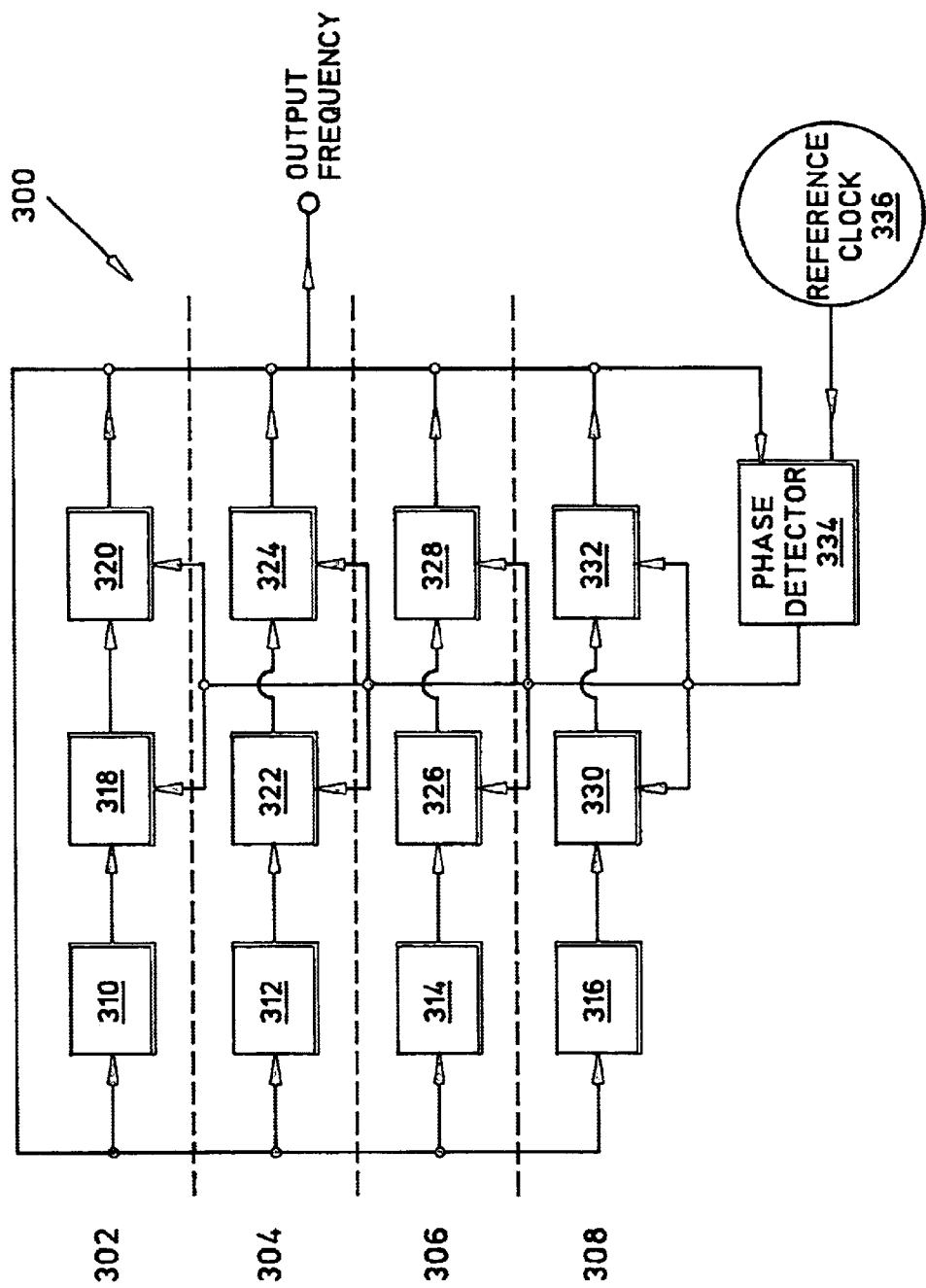
FIG. 6 is a schematic illustrating a preferred embodiment of the present invention low noise ring oscillator.

FIG. 6 is a schematic illustrating a preferred embodiment of the present invention low noise ring oscillator 300. Four parallel ring oscillator sections 302, 304, 306, and 308 are shown. Each ring oscillator section includes three delay sections. Delay sections 310, 312, 314, and 316 have fixed delay with respect to the frequency of oscillation. Delay sections 318 through 332 are variable delay sections as explained in the description, of the variable delay buffer 26 of FIG. 2. The frequency of oscillation is controlled through the use of a phase detector 334 and a reference clock 336. Alternate combinations of delay and variable delay sections can also be used to enable the invention.

Connecting the ring oscillator sections in parallel, permits the overall noise factor of the resultant oscillator output signal to be reduced. Returning to FIG. 3, the first ring oscillator section 102 output supplies a signal having a normalized noise factor of 1. Likewise, every other ring oscillator section also supplies a signal having a relative noise factor that is approximately the same as the first ring oscillator section 102. However, when connected (added in parallel) to the first ring oscillator section 102, additional ring oscillator sections reduce the relative noise factor by a value of $1/(N)^{1/2}$, where N equals the total number of ring oscillator sections. Table 1 illustrates the relationship between the number of ring oscillator sections and the relative reduction in noise.

TABLE 1

| NO. OF STAGES | NOISE | dB |
|---|---|---|
| 1 | 1 | 0 |
| 2 | .707 | −1.5 |
| 4 | .5 | −3 |
| 6 | .41 | −3.9 |
| 8 | .35 | −4.5 |
| 16 | .25 | −6 |
| 100 | .1 | −10 |

Figure 7:
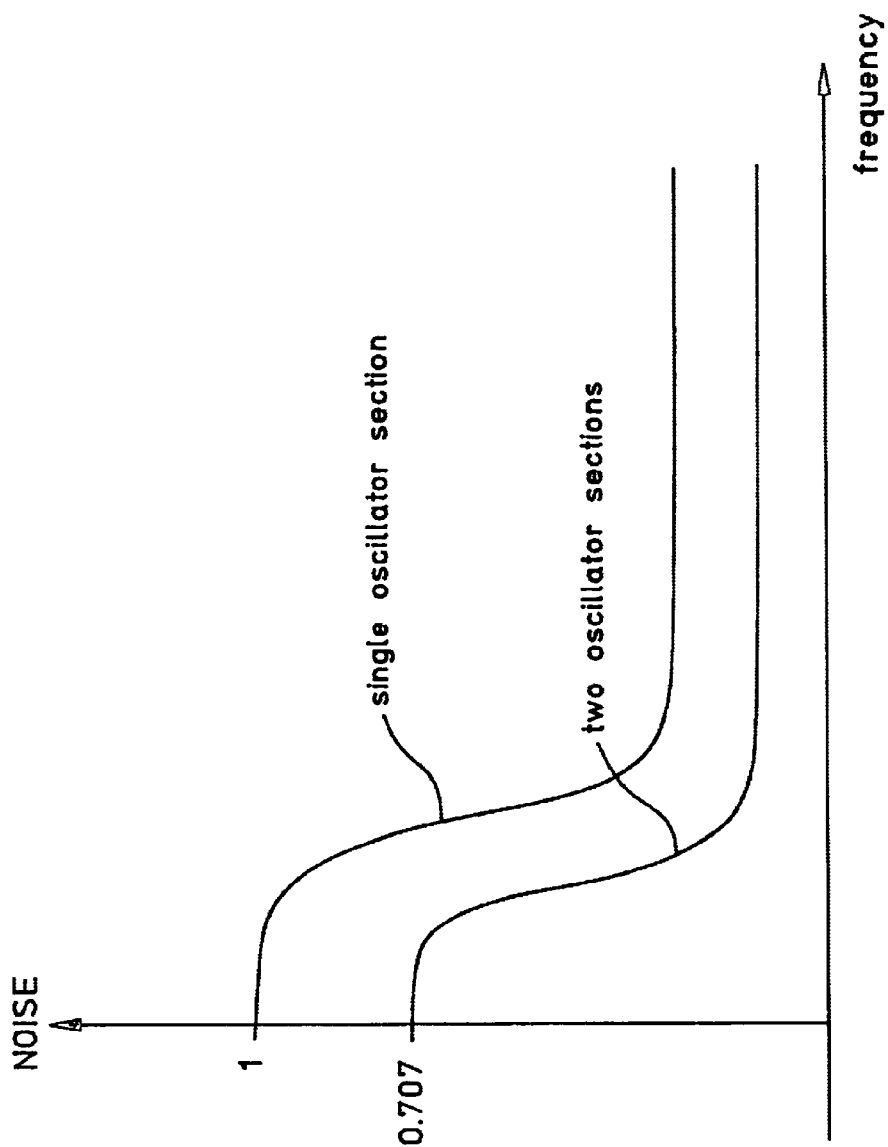
FIG. 7 is a graph illustrating the noise improvement inherent is connecting ring oscillator sections in parallel.

FIG. 7 is a graph illustrating the noise improvement inherent is connection ring oscillator sections in parallel. Noise measurements are often described in terms of the power density of the sideband noise with respect to the total signal power. Noise measurements are represented graphically by depicting the relationship between energy and frequency. The top curve illustrates the oscillator output signal of the first oscillator section 102, or any other single oscillator section. The graph shows a gaussian distribution from a frequency of zero Hertz. At zero Hertz the energy in the sidebands is normalized to a value of 1. By summing two oscillator signals having a gaussian energy distribution, the noise of the oscillator signal response is improved.

The bottom curve represents the addition of the output signals from two oscillator sections, such as the first and second oscillator sections 102 and 106. At zero Hertz the energy in the sidebands is now a normalized value of 0.707.

Figure 8:
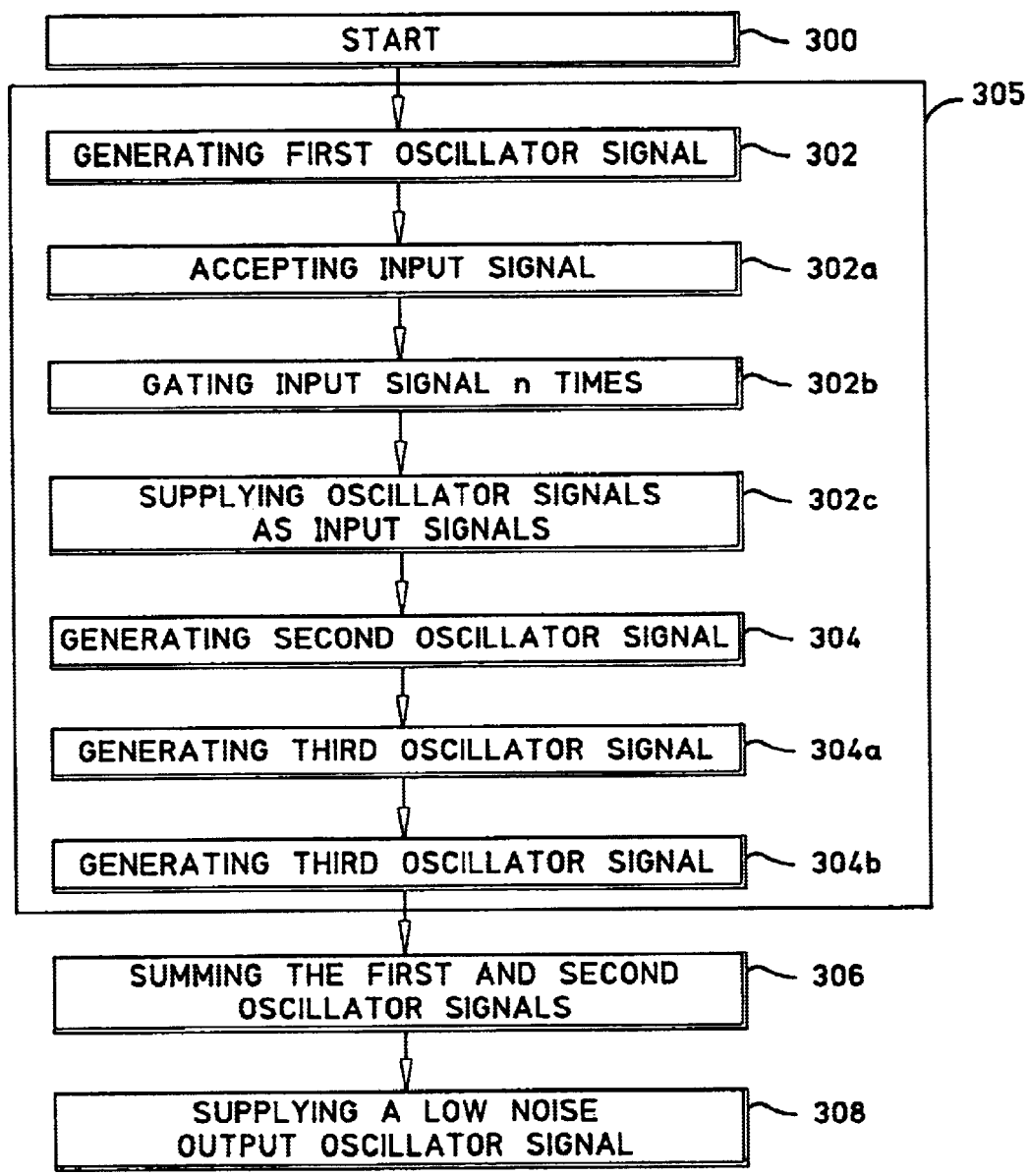
FIG. 8 is a flowchart illustrating a method for reducing noise in a ring oscillator signal of an integrated circuit.

FIG. 8 is a flowchart illustrating a method for reducing noise in a ring oscillator signal of an integrated circuit. Although the method is depicted as a sequence of numbered steps, no order should be inferred from the numbering unless explicitly stated. The method starts at Step 300. Step 302 generates a first oscillator signal at a first frequency. Step 304 generates a second oscillator signal at the first frequency. Step 306 sums the first and second oscillator signals. Step 308 supplies an output oscillator signal at the first frequency.

Generating the first oscillator signal at a first frequency in Step 302 includes generating the first oscillator signal at a first frequency and first relative noise factor, and generating the second oscillator signal at a first frequency in Step 304 includes generating the second oscillator signal at a first frequency and first relative noise factor. Then, supplying the output oscillator signal at the first frequency in Step 308 includes supplying the output oscillator signal at the first frequency and second relative noise factor, less than the first relative noise factor.

In some aspects of the invention, Step 304a generates a third oscillator signal at a first frequency and first relative noise factor. Then, summing the first and second oscillator signals in Step 306 includes summing the third oscillator signal to the first and second oscillator signal. Supplying the output oscillator signal at the first frequency in Step 308 includes supplying the output oscillator signal at the first frequency and third relative noise factor, less than the second relative noise factor. In some aspects, Step 304b generates a fourth oscillator signal at a first frequency and first relative noise factor. The fourth signal is added in Step 306 and presented as part of the sum of signals in Step 308. The output oscillator signal has a fourth relative noise factor that is even less than the third relative noise factor. The present invention is not limited to any particular number of oscillator signals.

In some aspects of the invention, Step 305 generates a plurality of oscillator signals at a first frequency and first relative noise factor. Then, summing the first and second oscillator signals in Step 306 includes summing the plurality of oscillator signals to the first and second oscillator signals, and supplying the output oscillator signal at the first frequency in Step 308 includes supplying the output oscillator signal at the first frequency and relative noise factor that is proportional to the total number of summed oscillator signals.

Supplying the output oscillator signal at the first frequency in Step 308 includes supplying the output oscillator signal at the first frequency and a relative noise factor that is calculated as follows:

relative noise=first relative noise factor/(the total number of summed oscillator signals)$^{1/2}$.

Generating the first and second oscillator signals in Steps 302 and 304 includes sub-steps. Step 302a accepts an input signal. Step 302b delays the input signal n times. Then, generating the first oscillator signal in Step 302 includes generating an oscillator signal that is an inverted and delayed input signal. Step 302c supplies the oscillator signals as the input signals.

Likewise, Step 304a accepts an input signal. Step 304b delays the input signal n times. Then, generating second oscillator signal in Step 304 includes generating an oscillator signal that is an inverted and delayed input signal. Step 304c supplies the oscillator signals as the input signals. Although only the generation of the first and second oscillator signals is detailed, the above-mentioned sub-steps would apply to the generation of any number of oscillator signals.

In some aspects of the invention, first and second ring oscillator sections are included, as described above and shown in FIGS. 3–5. Then, generating the first and second oscillator signals in Step 302 and 304 includes using the ring oscillator sections to generate the first and second oscillator signals.

A parallel combination of ring oscillator circuits configured in a CMOS IC have been presented above. Example circuits have been provided as an illustration of the concept. However, the present invention is applicable to any type of ring oscillator configuration. It should also be understood that the present invention is also applicable to a method of summing signals including random noise, however the signals are generated. Other variations and embodiments, beside the specific example presented above, will occur to those skilled in the art.

I claim:

1. An integrated circuit low noise oscillator comprising:
a first ring oscillator section for producing a first output signal having a normalized noise factor of 1, the first ring oscillator section having an input to receive an input signal and an output, connected to the input, to supply the first output signal; and
at least a second ring oscillator section having an input connected to the input of the first ring oscillator section and an output, connected to the input of the first ring oscillator section and to the input of the second ring oscillator section to supply a second output signal in phase with the input signal;
the outputs of the ring oscillator sections are connected to sum the output signals for providing an oscillator output signal having a noise factor of $1/(N)^{1/2}$, where N equals the total number of ring oscillator sections.

2. The oscillator of claim 1 further comprising:
a third ring oscillator section having an input and an output, both connected to the input of the first ring oscillator section; and
a fourth ring oscillator section having an input and an output, both connected to the input of the first ring oscillator section.

3. The oscillator of claim 1 wherein each ring oscillator section includes:
a plurality of n delay sections, each delay section having an input to accept a signal and an output to provide a signal that is delayed at the frequency of oscillation.

4. The oscillator of claim 3 wherein the plurality of delay sections are series connected, with the output of a delay section connected to the input of a subsequent delay section;
wherein a first delay section in the series of connected delay sections is connected to the input of the ring oscillator section to accept the input signal; and
wherein the output of the nth delay section is connected to the output of the ring oscillator section to provide the output signal.

5. The oscillator of claim 4 wherein the delay sections are selected from group including differential transistor pairs, NAND gates, NOR gates, AND gates, XOR gates, inverters, buffers, inverting buffers, and variable delay buffers.

6. The oscillator of claim 4 wherein the delay sections are fabricated as CMOS components.

7. The oscillator of claim 4 wherein each ring oscillator section includes a first fixed delay buffer, a second variable delay buffer, and a third variable delay buffer.

8. The oscillator of claim 7 further comprising:
a third ring oscillator section having an input and an output, both connected to the input of the first ring oscillator section; and
a fourth ring oscillator section having an input and an output, both connected to the input of the first ring oscillator section.

9. The oscillator of claim 3 further comprising:
tuning elements, having a frequency dependent reactance, connected to the ring oscillator sections.

10. In an integrated circuit, a method for reducing noise in a ring oscillator signal, the method comprising:
generating a first oscillator signal at a first frequency and first relative noise factor;
generating a second oscillator signal at the first frequency and first relative noise factor;
summing the first and second oscillator signals; and
supplying a summed output oscillator signal at the first frequency;
wherein supplying the output oscillator signal at the first frequency includes supplying the output oscillator signal at the first frequency and a second relative noise factor, less than the first relative noise factor.

11. The method of claim 10 further comprising:
generating a third oscillator signal at a first frequency and first relative noise factor;
wherein summing the first and second oscillator signals includes summing the third oscillator signal to the first and second oscillator signals; and
wherein supplying the output oscillator signal at the first frequency includes supplying the output oscillator signal at the first frequency and third relative noise factor, less than the second relative noise factor.

12. The method of claim 11 further comprising:
generating a fourth oscillator signal at a first frequency and first relative noise factor;
wherein summing the first, second, and third oscillator signals includes summing the fourth oscillator signal with the first, second, and third oscillator signals; and
wherein supplying the output oscillator signal at the first frequency includes supplying the output oscillator signal at the first frequency and fourth relative noise factor, less than the third relative noise factor.

13. The method of claim 12 further comprising:
generating a plurality of oscillator signals at a first frequency and first relative noise factor;
wherein summing the first and second oscillator signals includes summing the plurality of oscillator signals to the first and second oscillator signals; and
wherein supplying the output oscillator signal at the first frequency includes supplying the output oscillator signal at the first frequency and relative noise factor that is proportional to the total number of summed oscillator signals.

14. The method of claim 13 wherein supplying the output oscillator signal at the first frequency includes supplying the output oscillator signal at the first frequency and relative noise factor that is calculated as follows:

$$\text{relative noise} = \text{first relative noise factor}/(\text{the total number of summed oscillator signals})^{1/2}.$$

15. The method of claim 14 wherein generating the first and second oscillator signals includes;

accepting an input signal;

delaying the input signal n times;

wherein generating the first and second oscillator signals includes generating an oscillator output signal that is an inverted and delayed input signal; and the method further comprising:

supplying the oscillator output signals as the input signal.

16. The method of claim 15 in which a first ring oscillator and a second ring oscillator section are included;

wherein generating the first and second oscillator signals includes using the ring oscillator sections to generate the first and second oscillator signals.

17. An integrated circuit oscillator having a relative noise factor and comprising:

a number, N, of ring oscillator sections, each ring oscillator section having an input and an output connected to each input of each other ring oscillator sections of the plurality and for producing, at the output, an output signal having a noise factor of 1 and in phase with an input signal received at the input, the outputs connected to sum the output signals from each ring oscillator to form a combined output signal having a noise factor of $1/(N)^{1/2}$.

* * * * *